(12) United States Patent
Zhang et al.

(10) Patent No.: US 9,905,566 B2
(45) Date of Patent: *Feb. 27, 2018

(54) MASK READ-ONLY MEMORY DEVICE AND FABRICATION METHOD THEREOF

(71) Applicant: Semiconductor Manufacturing International (Shanghai) Corporation, Shanghai (CN)

(72) Inventors: Chao Zhang, Shanghai (CN); Yipeng Chan, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 22 days.

This patent is subject to a terminal disclaimer.

(21) Appl. No.: 14/989,494

(22) Filed: Jan. 6, 2016

(65) Prior Publication Data
US 2016/0197087 A1    Jul. 7, 2016

(30) Foreign Application Priority Data
Jan. 7, 2015 (CN) .......................... 2015 1 0006957

(51) Int. Cl.
*H01L 27/112* (2006.01)

(52) U.S. Cl.
CPC ...... *H01L 27/11253* (2013.01); *H01L 27/112* (2013.01)

(58) Field of Classification Search
CPC .......................... H01L 27/112; H01L 27/11253
See application file for complete search history.

(56) References Cited

U.S. PATENT DOCUMENTS

| 8,476,085 B1 * | 7/2013 | Zhang | H01L 21/76224 257/200 |
| 8,507,997 B2 * | 8/2013 | Yang | H01L 27/0203 257/390 |
| 9,070,620 B2 * | 6/2015 | Zhang | H01L 27/2409 |

OTHER PUBLICATIONS

Wolf et al., Silicon Processing for the VLSI Era, vol. 1—Process Technology, Lattice Press, 1986, pp. 133-136.*
Wolf et al., Silicon Processing for the VLSI Era, vol. 1—Process Technology, Lattice Press, 1986, pp. 142-145.*

* cited by examiner

*Primary Examiner* — Jose R Diaz
(74) *Attorney, Agent, or Firm* — Anova Law Group, PLLC

(57) ABSTRACT

The disclosed subject matter provides a mask read-only memory (M-ROM) device and fabrication method thereof. In an M-ROM device, a first layer having a first type doping is formed in a substrate. A plurality of buried lines is formed in the first layer of the substrate. The plurality of buried lines are arranged in parallel in a first direction and isolated from each other. An epitaxial growth process is used to form a second layer on the first layer of the substrate. A plurality of diodes is formed in the second layer. The plurality of diodes is arranged in an array. Each diode includes a first electrode having a second type doping and connecting with one of the plurality of buried lines, and a second electrode having a first type doping and located on the first electrode.

14 Claims, 12 Drawing Sheets

MASK READ-ONLY MEMORY DEVICE AND FABRICATION METHOD THEREOF

CROSS-REFERENCES TO RELATED APPLICATIONS

This application claims priority of Chinese Patent Application No. 201510006957.1 filed on Jan. 7, 2015, which is hereby incorporated by reference herein its entirety.

TECHNICAL FIELD

The disclosed subject matter generally relates to semiconductor technologies and, more particularly, relates to a mask read-only memory (M-ROM) device, and a related fabrication method.

BACKGROUND

A read-only memory (ROM) is a class of storage used in computers and other electronic devices. Once original data is stored in a ROM, during an execution of the program, it is only allowed to read out the stored information, but not allowed to arbitrarily write in new information or change the original data. Therefore, the ROM is mainly used to distribute firmware, such as fixed programs, constants, character fonts, and operating systems, etc.

Mask read-only memory (M-ROM) is a class of read-only memory. One type of M-ROM uses metal-oxide-semiconductor field-effect transistors (MOSFET) as memory cells. In a MOSFET based M-ROM, impurities are doped into selected channel regions so as to provide the associated memory cells with different threshold voltage levels representing the storage of different values of the binary-coded data. Each ROM cell is in a logic state of "1" or "0" depending on whether ions are implanted into the channel region or not.

However, the MOSFET based M-ROM is limited due to the large cell size and high product cost. In one aspect, size shrinkage of each ROM cell faces big challenges. In another aspect, conventional metal-oxide-semiconductor (MOS) switches suffer a number of problems including, short channel effect, hot carriers, punch through, etc. These disadvantages constrain the applications of MOS switches in further high density M-ROM.

To solve the above mentioned problems, another type of M-ROM uses PN junction diodes as memory cells. In a diode based M-ROM, multiple bit lines correspond to each diode in a same word line so as to provide the associated memory cells with different voltage levels (e.g., Vdd and Vss) representing the storage of different values of the binary-coded data. Each ROM cell is in a logic state of "1" or "0" depending on whether a bit line electrically connects to the associated diode or not.

In a fabricating process of the diode based M-ROM, the multiple diodes are usually produced during formation of an interconnect structure after a CMOS device being formed on a semiconductor substrate. Specific steps include:

First, forming contact holes in an interlayer dielectric layer, filling the contact holes with amorphous silicon and performing a recrystallization process to convert the amorphous silicon into polysilicon. The recrystallization process usually requires a long time (around 10 hours) and a high temperature (about 600° C.).

Next, doping the polysilicon to obtain PN junction diodes, and performing an annealing process to activate the doped impurities. The annealing process also requires a long time (around 1 hour) and a high annealing temperature (about 850° C. to 900° C.). During the process of formation of the diode, a high temperature condition for a long time may cause a negative impact to the CMOS devices on the semiconductor substrate, such as changing the electrical properties, damaging the device and so on, which can result in poor device performances and decreasing reliability.

So, for the diode based M-ROM, it is hard to integrate with the traditional CMOS technique due to high thermal budget after CMOS process, especially for 45-nm-node and beyond.

Accordingly, it is desirable to provide a mask read-only memory (M-ROM), and a related fabricating method to solve one or more problems set forth above and to solve other problems in the art.

BRIEF SUMMARY

In accordance with some embodiments of the disclosed subject matter, a mask read-only memory (M-ROM), and a related fabricating method are provided.

An aspect of the present disclosure provides a method for fabricating a mask read-only memory (M-ROM). A first layer having a first type doping is formed in a substrate. A plurality of buried lines is formed in the first layer of the substrate. The plurality of buried lines are arranged in parallel in a first direction and isolated from each other. An epitaxial growth process is used to form a second layer on the first layer of the substrate. A plurality of diodes is formed in the second layer. The plurality of diodes is arranged in an array. Each diode includes a first electrode having a second type doping and connecting with one of the plurality of buried lines, and a second electrode having a first type doping and located on the first electrode.

Another aspect of the present disclosure provides a mask read-only memory (M-ROM). The mask read-only memory device includes a substrate including a first layer having a first type doping and a second layer on the first layer. The first layer of the substrate includes a plurality of buried lines having the first type doping. The plurality of buried lines are arranged in parallel in a first direction and isolated from each other. The second layer includes a plurality of diodes arranged in an array. Each diode includes: a first electrode having a second type doping and connecting with one of the plurality of buried lines, and a second electrode having a first type doping and located on the first electrode. The mask read-only memory device also includes a MOS transistor on the second layer.

Other aspects of the present disclosure can be understood by those skilled in the art in light of the description, the claims, and the drawings of one disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides a diode-based mask read-only memory (M-ROM), and a related fabricating method.

FIGS. 1-14 show schematic diagrams of an exemplary mask read-only memory at various stages during its fabricating process in accordance with various embodiments of the disclosed subject matter.

Figure 1:
FIGS. 1-14 are schematic diagrams of an exemplary mask read-only memory at various stages during its fabricating process in accordance with various embodiments of the disclosed subject matter.
Figure 2:
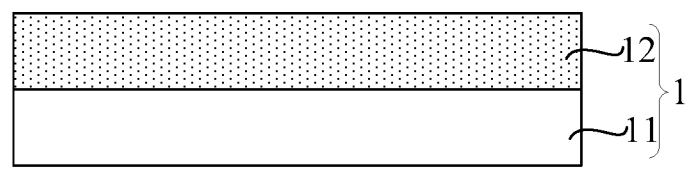

Referring to FIGS. 1-2, first substrate 1 can be provided. As illustrated in FIG. 2, first type ions can be implanted into first layer 12 of first substrate 1 to form a first type doped layer. In some embodiments, first substrate 1 can be a second type doped substrate. In one embodiment, the second type dopant is a P-type dopant. In some other embodiments, the second type dopant may also be an N-type dopant.

The second type doping in first substrate 1 can be formed by an ion implantation process. In this process, the second type ions can be boron (B), boron bifluoride ($BF_2$), indium (In), or a combination thereof. Taking boron (B) as an example, a dose range can be from $2.0e13$ $cm^{-2}$ to $2.0e14$ $cm^{-2}$. The dose range can provide first substrate 1 with a low concentration of dopant and a high resistance to prevent leakage current. An ion implantation energy range can be from 5 KeV to 15 KeV, which can ensure the implanted ions reaching a desired depth into first substrate 1.

In various embodiments, first substrate 1 can be a silicon substrate, a germanium substrate, a silicon-germanium substrate, a gallium arsenide substrate, a silicon substrate on an insulator, or any other suitable substrate. In one embodiment, first substrate 1 can be chosen as a silicon substrate, because it has a lower cost for implementing the disclosed subject matter on silicon substrates than on other types of substrates.

Referring back to FIG. 2, third layer 11 of first substrate 1 is under first layer 12 of first substrate 1, and is a second type doped layer. The first type doping and the second type doping have opposite conductivities.

First layer 12 of first substrate 1 is used for forming buried lines. Diode memory cells of M-ROM can be formed on the buried lines. An electrode located in the bottom of each diode can electrically connect with a buried line. A PN junction can be formed between first layer 12 and third layer 11 of first substrate 1 to prevent a leakage from the diode to third layer 11.

In one embodiment, the second type ions are P type ions, the first type ions are N-type ions. The first type ions can be one or two kinds of ions selected from arsenic (As), phosphorus (P), and antimony (Sb). Taking As as an example, a dose range can be from $1.0e15$ $cm^{-2}$ to $8.0e15$ $cm^2$. Comparing to third layer 11, first layer 12 is heavily doped, since a high dopant concentration can reduce a resistance of first layer 12 to achieve a faster signal transmission speed. An ion implantation energy range can be from 30 KeV to 80 KeV, which can ensure the implanted ions reach a desired depth into first substrate 1.

In some other embodiments, the second type ions can be N-type ions, and the first type ions can be P-type ions.

Next, a high temperature annealing process can be performed to activate the doped first type ions in first layer 12. During the annealing process, an annealing temperature range can be from 950° C. to 1150° C., and an annealing time range can be from 10 s to 120 min, to allow the dopant in first layer 12 to be fully activated.

Figure 3:
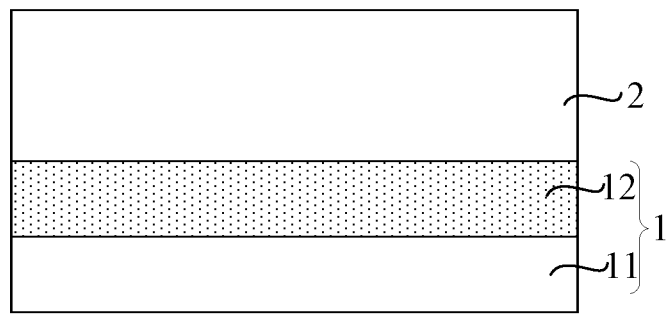

Referring to FIG. 3, second substrate 2 can be formed on first substrate 1. Second substrate 2 can be in contact with first layer 12 of first substrate 1. Second substrate 2 can be used for forming multiple diodes in subsequent processes.

In one embodiment, an epitaxial (EPI) processes, such as a selective epitaxial process or a non-selective epitaxial process, can be used for forming second substrate 2 on first layer 12 of first substrate 1. The epitaxial process can allow second substrate 2 to grow in a particular direction. Second substrate 2 and first substrate 1 can have same lattice structures, so they can firmly combine together.

As an example, first substrate 1 can be a monocrystalline silicon substrate, and second substrate 2 can also be a monocrystalline silicon substrate. In conventional diode-based M-ROMs, the material of diodes is normally polysilicon. Since the polysilicon is in an unstable state due to its disordered atomic structure, a carrier drifting phenomenon may be occurred when a polysilicon diode is operating, which can generate a big reverse leakage current, and can result in incorrect memory data reading. In contrast, monocrystalline silicon is used to form diodes in one embodiment. Comparing to polysilicon, monocrystalline silicon has a steady state due to its ordered atomic structure. A monocrystalline silicon diode can have a high driving current, and do not initiate a carrier drifting phenomenon, which can greatly reduce the reverse leakage current, and can ensure a correct memory data reading.

In particular, the epitaxial (EPI) process can be: chemical vapor phase epitaxial (CVPE), or molecular beam epitaxy (MBE).

Chemical vapor phase epitaxial can be performed in a chemical vapor deposition system.

Molecular beam epitaxial can be performed under an ultrahigh vacuum condition.

A furnace having silicon material therein can be heated to produce silicon vapor. The silicon vapor can be collimated by going through small holes to form atomic beams or molecular beams that are injected directly onto a surface of first substrate 1 along a linear direction. Controlling the atomic beams or molecular beams to scan the surface of first substrate 1 can make a silicon layer grow on the surface of first substrate 1 along a crystal orientation to form second substrate 2.

In one embodiment, a chemical vapor phase epitaxy can be used to form second substrate 2.

In some implementations, a selective epitaxial process can be performed at a high temperature to form second substrate 2. The temperature range can be from 950° C. to 1100° C. A material gas used in the selective epitaxial process can be dichlorosilane ($SiH_2Cl_2$ or $Si_2H_2Cl_2$).

In some other implementations, a selective epitaxial process can be performed at a low temperature to form second substrate 2. The temperature range can be from 500° C. to 900° C. A material gas used in the selective epitaxial process can be selected from $SiH_4$, $SiHCl$, $SiHCl_3$, and their combination. A low temperature condition can avoid diffusion of the first type impurities in first layer 12 along a direction parallel to the upper surface of first substrate 1. So a first type doping can be prevented in a formation region of CMOS devices. Additionally, the low temperature condition can also avoid diffusion of the first type impurities in first layer 12 along a downward direction to third layer 11. So a leakage current problem of third layer 11 caused by concentration reduction and/or depth reduction can be prevented.

In one embodiment, a thickness range of second substrate 2 can be from 100 nm to 600 nm. The thickness of second substrate 2 can be equal to a length of a diode in a direction from P pole to N pole.

After the second substrate 2 is formed on first substrate 1, second substrate 2 can be regard as a second layer of a total substrate that includes first substrate 1 and second substrate 2. So as illustrated in FIG. 3, first layer 12 is sandwiched by second layer 2 and third layer 11.

Figure 4:
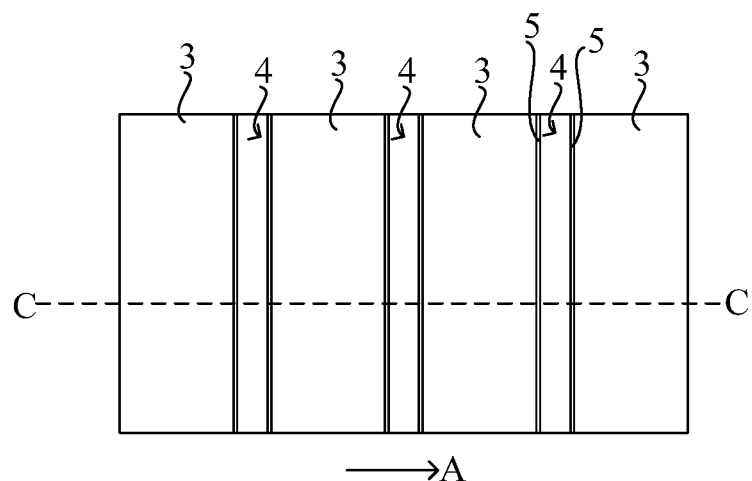
Figure 5:
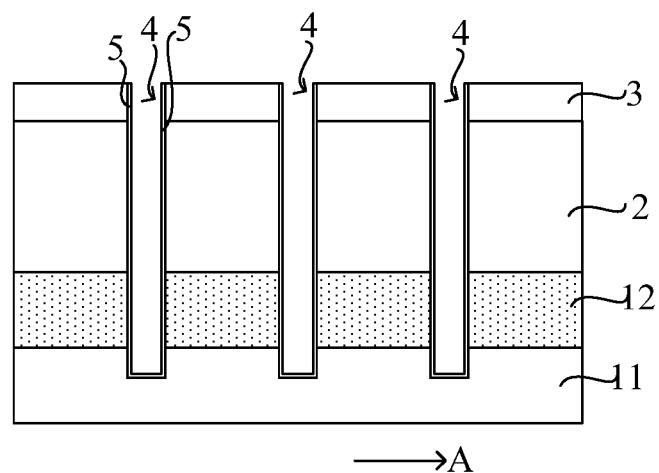

Turning to FIGS. 4 and 5, a top view of an exemplary M-ROM in a fabricating stage is shown in FIG. 4, and a sectional view along a CC direction of the M-ROM in the fabricating stage is shown in FIG. 5. A patterned mask layer 3 can be formed on second substrate 2. The patterned mask layer 3 can define the positions of second trenches. The material of patterned mask layer 3 can be photoresist or any other suitable mask material.

Next, using patterned mask layer 3 as a mask, second substrate 2 can be etched. First layer 12 can be etched to form multiple second trenches 4 that are arranged in parallel along a first direction A. Second trenches 4 can extend from first layer 12 downward into third layer 11. The first direction A is an extending direction of the bit lines. A depth of second trenches 4 is greater than or equal to 0.4 µm. The depth of second trenches 4 can provide better isolation. If the depth of second trenches 4 is less than 0.4 µm, a depth of a first isolation structure formed in a subsequent step may not be deep enough, which may cause a signal crosstalk problem between diodes located on two sides of the first isolation structure along the first direction A.

Thereafter, multiple first liner layer 5 can be formed on sidewalls and bottom layers of second trenches 4. The material of first liner layer 5 can be silicon oxide. In a subsequent insulating material deposition process, first liner layer 5 can be used for improving interface properties between the insulating material and the sidewalls as well as the bottom layers of second trenches 4. First liner layer 5 can be adhered tightly to the sidewalls and the bottom layers of second trenches 4, and the insulating material can be adhered tightly to first liner layer 5.

Figure 6:
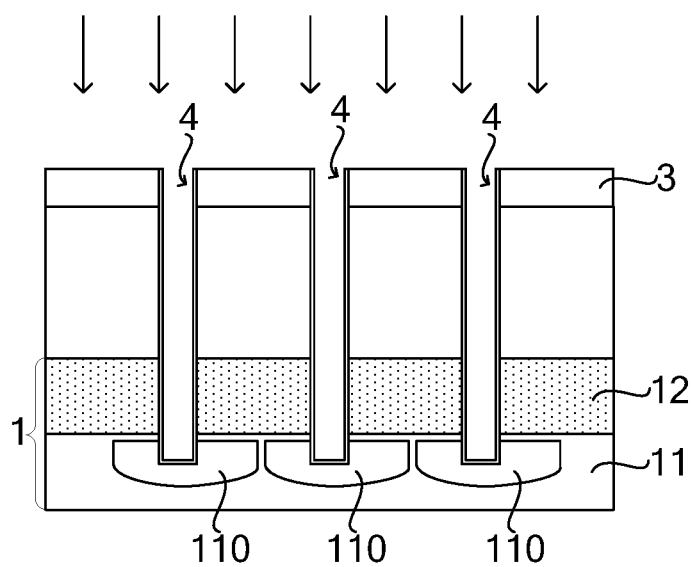

Referring to FIG. 6, using patterned mask layer 3 as a mask, a second type ion implantation can be performed to bottom layers of second trenches 4. The second type ions can locate in first liner layer 5 in bottom layers of second trenches 4 and third layer 11.

After that, a pushing-well process can be used to drive the second type ions from first liner layer 5 and third layer 11 to diffuse into third layer 11 to form multiple diffusion regions 110. Diffusion regions 110 can be used for isolating buried lines from underlying third layer 11. In some embodiments, a material used during the second type ions implantation process can be either boron (B) or boron bifluoride ($BF_2$).

Taking boron (B) as an example, during the second type ions implantation process, a dose range can be from $5.0e13$ $cm^{-2}$ to $8.0e14$ $cm^{-2}$. The dose range can make a high concentration of dopant for providing a sufficient dose of ions for the subsequent formation of diffusion regions 110. An ion implantation energy range can be from 5 KeV to 15 KeV, which can ensure the implanted ions penetrating a desired depth of first liner layer 5 and third layer 11.

The pushing-well process can be also known as ion-driven method. In a high temperature condition, the second type ions can diffuse in the semiconductor substrate. Two adjacent diffusion regions 110 may be in contact with each other, which can provide a better isolation. A doping concentration of diffusion regions 110 can be greater than a doping concentration of third layer 11, which can not only prevent a signal crosstalk problem between adjacent diodes, but also prevent a current leakage problem between the diodes and first substrate 1.

Figure 7:
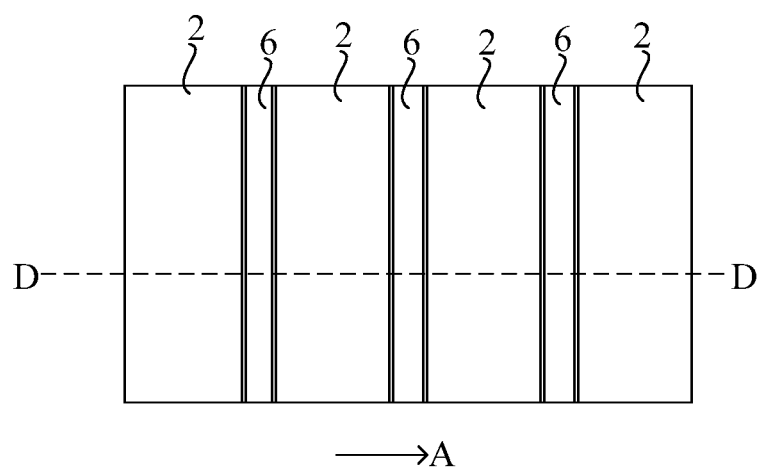
Figure 8:
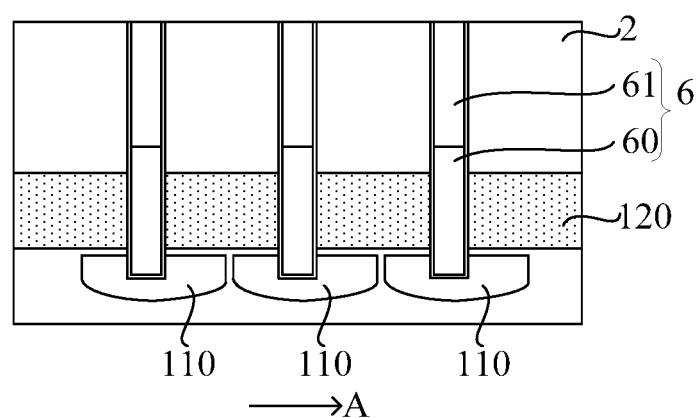

Turning to FIGS. 7 and 8, a top view of the exemplary M-ROM in a next fabricating stage is shown in FIG. 7, and a sectional view along a DD direction of the M-ROM in the same fabricating stage is shown in FIG. 8. As illustrated, an isolating material can fill up multiple second trenches 4 (referring to FIG. 6). So multiple first isolation structures 6 can be formed in parallel along the first direction A in second substrate 2 and partially in first substrate 1.

First isolation structures 6 are deep-trench isolation structures. Multiple buried lines 120 are first layer 12 between adjacent first isolation structures 6. Multiple buried lines 120 are parallel arranged in the first direction A. Adjacent buried lines 120 are isolated by first isolation structures 6. In addition, two adjacent buried lines and a diffusion region 110 below the two adjacent buried lines can constitute a parasitic transistor that can further avoid crosstalk between the two adjacent buried lines.

As illustrated in FIG. 8, in one embodiment, each first isolation structure 6 can include polysilicon layer 60, and dielectric layer 61.

Polysilicon layer 60 is not doped, and can make an insulating and isolating function. Dielectric layer 61 is located on polysilicon layer 60, and can be used for preventing an implantation to an upper surface of polysilicon layer 60 in subsequent processes. Dielectric layer 61 can be formed using silicon oxide or any other suitable dielectric material. Since the width and the depth of second trenches 4 are relatively large, comparing to dielectric materials, polysilicon material can have a better trench-filling capability, and can have a better compactness. So polysilicon can not only be adhered on first liner layer 5 on sidewalls and bottom layers of second trenches 4 firmly, but also have a good compactness.

Specifically, a method for forming first isolation structures 6 in second trenches 4 can include:

Forming isolating material in multiple second trenches 4 and on patterned mask layer 3, wherein the isolating material fills up multiple second trenches 4.

Planarizing insulating material using chemical mechanical polishing process until an upper surface of patterned mask layer 3 is exposed. Then continuously polishing insulating material, patterned mask layer 3, and first liner layer 5 that are higher than an upper surface of second substrate 2.

After the above two steps, patterned mask layer 3 can be removed, and first isolation structures 6 can be formed in second trenches 4.

Figure 9:
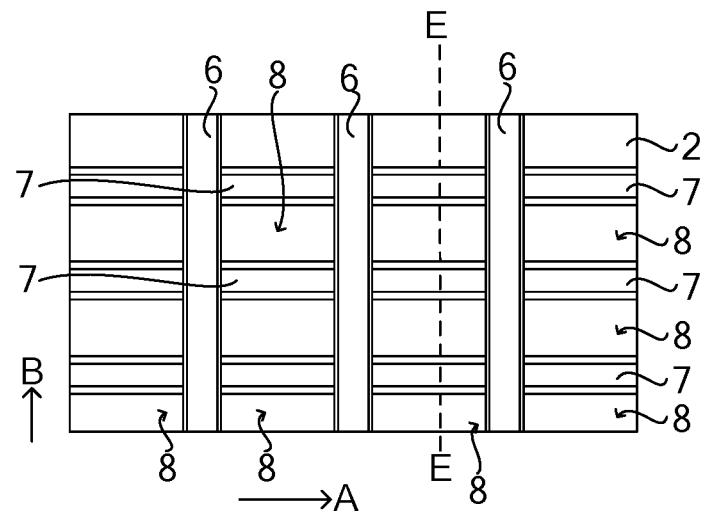
Figure 10:
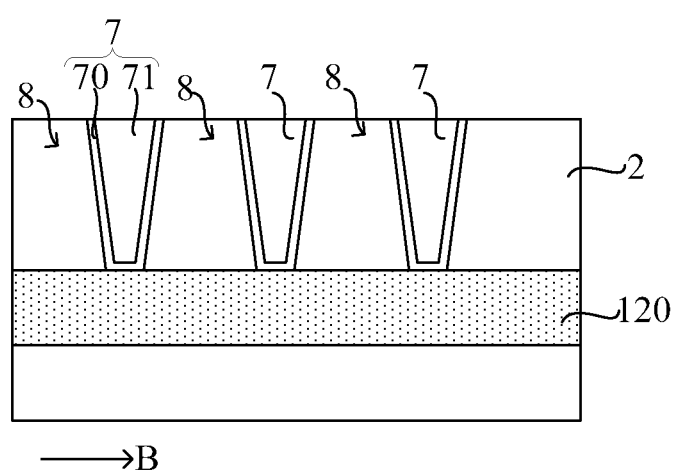

Turning to FIGS. 9 and 10, a top view of the exemplary M-ROM in a next fabricating stage is shown in FIG. 9, and a sectional view along a EE direction of the M-ROM in the same fabricating stage is shown in FIG. 10. As illustrated, multiple second isolation structures 7 are formed in second substrate 2. Second isolation structures 7 include shallow trench isolation structures parallel arranged in second direction B on multiple buried lines 120. Multiple storage regions 8 are second substrate 2 between adjacent second isolation structures 7. Each storage region 8 is a diode forming region. First direction A and second direction B are two different directions which are perpendicular to each other. Second direction B is a direction of the word lines of the disclosed M-ROM.

In one embodiment, first isolation structures 6 can be formed earlier to define buried lines 120, and second isolation structures 7 can be formed afterwards to define storage regions 8. In some other embodiments, the order may also be inversed: second isolation structures 7 may be formed earlier to define storage regions 8, and first isolation structures 6 may be formed afterwards to define the embedding buried lines 120.

Thus, multiple storage regions 8 can be arranged in an array. In the first direction A, each row of storage regions 8 are separated by first isolation structures 6. In the second direction B, each line of storage regions 8 are separated by second isolation structures 7. Each storage region 8 is used for forming a diode as a memory cell of the disclosed M-ROM.

In one embodiment, a method of forming second isolation structures 7 can include:

Forming patterned mask layer (not shown in the drawings) on second substrate 2;

Using the patterned mask layer as a mask, etching second substrate 2 to form multiple trenches;

Forming second liner layer 70 on sidewalls and bottom layers of the multiple trenches;

Filling the multiple trenches with dielectric material 71, such as silicon oxide.

After the above four steps, patterned mask layer can be removed, and second isolation structures 7 can be formed in the trenches.

In one embodiment, a depth of second isolation structures 7 can equal to a thickness of second substrate 2. In some other embodiments, a depth of second isolation structures 7 may be greater than a thickness of second substrate 2, and second isolation structure 7 may extend downwardly from second substrate 2 into first layer 12.

Figure 11:
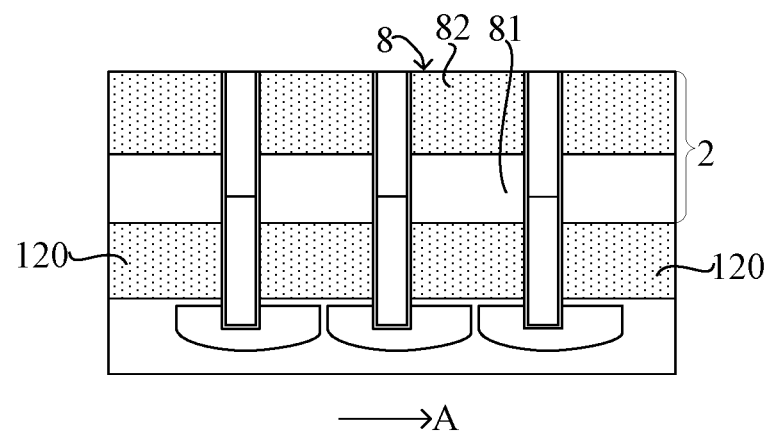
Figure 12:
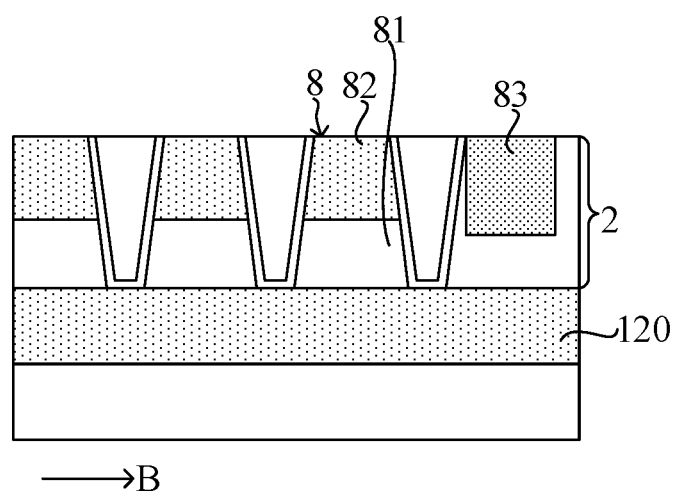

Turning to FIGS. 11 and 12, a sectional view along the first direction A of the exemplary M-ROM in a next fabricating stage is shown in FIG. 11, and a sectional view along the second direction B of the M-ROM in the same fabricating stage is shown in FIG. 12.

As illustrated, multiple diodes can be formed in storage regions 8. Each diode can include first electrode 81 and second electrode 82. First electrode 81 can have a second type doping, and can be electrically connected with underlying buried line 120. Second electrode 82 is located above first electrode 81, and can have a first type doping. First electrode 81 and second electrode 82 can constitute a diode as a memory cell.

In one embodiment, a method for forming multiple first electrodes 81 and multiple second electrodes 82 in storage regions 8 can include: first, performing a second type ion implantation to second substrate 2 to form second type doping; then, performing a first type ion implantation to an upper layer of second substrate 2 that has a second type doping. So that the upper layer of second substrate 2 can have an opposite type doping and form multiple second electrodes 82, while a lower layer of second substrate 2 below second electrode 82 can be multiple first electrodes 81.

Comparing to buried lines 120, second electrodes 82 are lightly doped. A low doping concentration and a high resistance can facilitate transferring electrical signals to buried lines 120. In some other embodiments, a high-temperature treatment can be performed to prompt the first type dopant in buried lines 120 to diffuse upward to a target thickness.

In one embodiments, in the second type ion implantation process for forming second electrodes 82, the second type ions can be boron (B), boron bifluoride ($BF_2$), indium (In), or a combination thereof.

Taking boron (B) as an example, a dose range can be from $2.0e13$ $cm^{-2}$ to $2.0e14$ $cm^2$. The dose range can make a heavily dopant concentration for second electrodes 82. An ion implantation energy range can be from 15 KeV to 35 KeV, which can ensure the implanted ions reaching a desired depth into second substrate 2.

Taking boron bifluoride ($BF_2$) as another example, a dose range can be from $8.0e13$ $cm^{-2}$ to $9.0e14$ $cm^2$, and an ion implantation energy range can be from 5 KeV to 20 KeV. Since $BF_2$ has a larger molecular weight compared to B, $BF_2$ can contribute more to a surface amorphization of second substrate 2.

In one embodiment, a first electrode 81 and a corresponding second electrode 82 constitute a diode. The above described dose ranges and ion implantation energy ranges of first electrode 81 and second electrode 82 can ensure a high driving current and a normal working environment of the diode. Since the first electrode 81 is N-type doped and the second electrode 82 is P-type doped, a high voltage can be applied to first electrode 81 and a low voltage can be applied to second electrode 82 to make the diode conducted.

Taking boron (B) as an example, if a dose range of second electrode 82 is less than $1.0e15$ $cm^{-2}$, or if a depth of second electrode 82 is too shallow due to a small ion implantation energy during the second type ion implantation process, a driving ability of first electrode 81 may be not enough, and a reverse conduction of the diode may occur, resulting in the diode cannot start up normally. If a dose range of second electrode 82 is larger than $2.0e14$ $cm^{-2}$, or if a depth of second electrode 82 is too deep due to a large ion implantation energy during the second type ion implantation process, a forward punch through of the diode may occur, and the diode may be turned on even it is not in a conductive condition, resulting in a failure of a data memory of the diode.

In a fabricating process for an existing diode-based M-ROM, it is difficult to perform ion implantation through small contact holes into polysilicon material. In one embodiment, first isolation structures 6 and second isolation structures 7 can be used as masks during the ion implantation processes. As such, ion implantation windows can be very large, and the injection process can be precisely controlled.

Referring to FIG. 12, during the first type ion implantation process performed on a layer of second substrate 2 that is in storage regions 8, the first type ion implantation process can also be performed along the second direction B on another layer of second substrate 2 to form lead region 83. Lead region 83 is above buried lines 120 and isolated with all diodes. Multiple word lines formed in subsequent processes can be electrically connected with buried lines 120 through lead region 83.

After the second type ion implantation process has been performed on second substrate 2 to form first electrodes 81 in storage regions 8, a first type ion implantation process can be performed on lead region 83 to form heavily doped wiring electrode.

In one embodiments, in the first type ion implantation process on lead region 83, the first type ions can be arsenic (As), phosphorus (P), antimony (Sb), or a combination thereof. Taking arsenic (As) as an example, a dose range can be from $1.0e15$ $cm^{-2}$ to $8.0e15$ $cm^{-2}$. Adding a dopant concentration in the previous step, a dopant concentration of lead region 83 can be further increased. An ion implantation energy range can be from 15 KeV to 65 KeV, which can ensure the implanted ions reaching a desired depth.

It should be noted that, in one embodiment, first solation structures 6 and second isolation structures 7 are formed before first electrodes 81 and second electrodes 82. In some other embodiments, the order can be inverse: after forming first electrodes 81 and second electrodes 82, then first solation structures 6 and second isolation structures 7 can be formed. In this case, an injection window can be large enough, and parameters in the ion implantation processes can be accurately controlled.

It should be noted that, in one embodiment, second substrate 2 is epitaxially grown on first substrate 1. In some other embodiments, a semiconductor substrate having a second doping type can be provided. Then a first type doping can be performed to an upper layer of the semiconductor substrate to form an oppositely doped second layer, and an lower layer of the semiconductor substrate remains a second doping type is a third layer. Then a second type doping can be performed to an upper layer of the second layer to form a second electrode, and a lower layer of the second layer is a first electrode.

Figure 13:
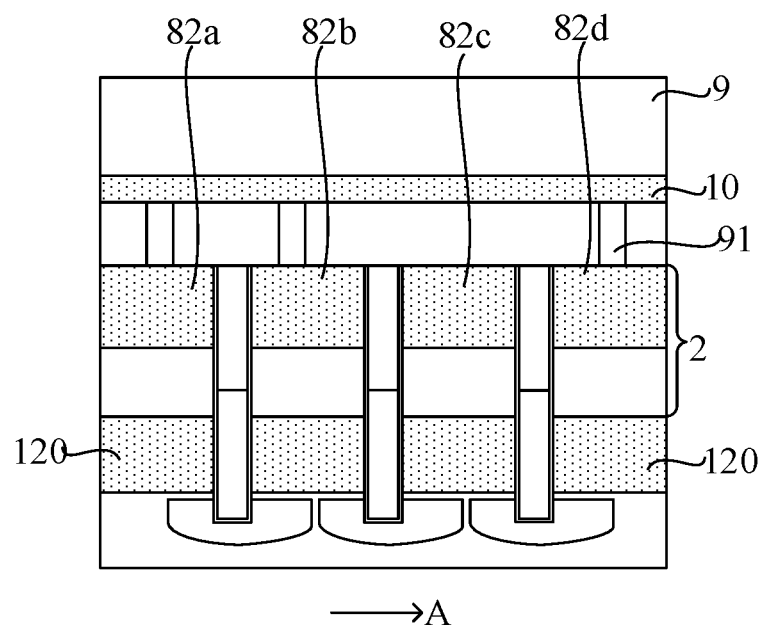
Figure 14:
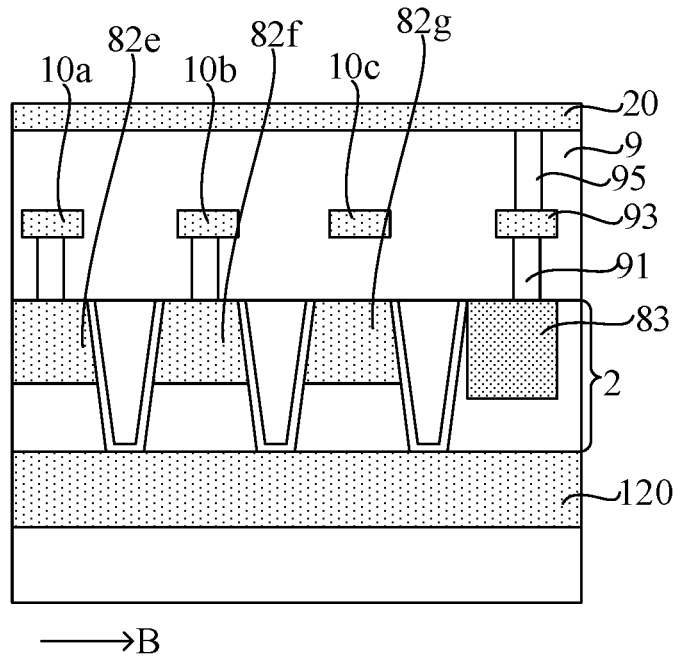

Turning to FIGS. 13 and 14, a sectional view along the first direction A of the exemplary M-ROM in a next fabricating stage is shown in FIG. 13, and a sectional view along the second direction B of the M-ROM in the same fabricating stage is shown in FIG. 14.

As illustrated, interlayer dielectric layer 9 can be formed on second substrate 2, multiple bit lines 10 can be formed in interlayer dielectric layer 9 along first direction A, multiple word lines 20 can be formed on interlayer dielectric layer 9 along second direction B.

Word lines 20 are located above and perpendicular with bit lines 10.

Bit lines 10 are electrically connected with second electrodes 82 by conductive plugs 91.

Each word line 20 is electrically connected with a buried line 120 through lead region 83.

A method for forming word lines 20 and bit lines 10 can include:

Depositing a first interlayer dielectric layer on second substrate 2;

Forming multiple via holes that expose second electrodes 82 and lead region 83, and filling up the multiple via holes with conductive material to form multiple conductive plugs 91;

Forming a second interlayer dielectric layer on first interlayer dielectric layer;

Forming multiple trenches in second interlayer dielectric layer, wherein the multiple trenches are arranged in parallel along the second direction B. Each trench can expose upper surfaces of conductive plugs 91 along the first direction A. Then filling up the multiple trenches with conductive material (e.g. copper) to form multiple bit lines 10 and metal wire 93. Each bit line 10 is electrically connected with several conductive plugs 91. Metal wire 12 is in a same layer of bit lines 10 and is electrically connected with lead region 83. In some other embodiments, conductive plugs 91 and bit lines 10 that are electrically connected with conductive plugs 91 can be formed in a single process by a dual Damascene technique.

Similarly, a third interlayer dielectric layer can be formed on second interlayer dielectric layer, multiple conductive plugs 95 electrically connected with lead region 83 can be formed in third interlayer dielectric layer, and multiple word lines 20 electrically connected with conductive plugs 21 can be formed on third interlayer dielectric layer. Interlayer dielectric layer 9 can include the first interlayer dielectric layer, the second interlayer dielectric layer, and the third interlayer dielectric layer.

As described above, a mask read-only memory (M-ROM) can be provided. In the M-ROM, multiple memory cells can be distributed in an array. As illustrated in FIG. 13, in first direction A, each bit line is selectively connected with second electrodes 82 above certain buried lines 120, and is also selectively disconnected with second electrodes 82 above other buried lines 120. For example, second electrodes 82a, 82b, and 82d are electrically connected with a single bit line 10 through conductive plugs 91 respectively, as shown in FIG. 13. As illustrated in FIG. 14, in the second direction B, above a single buried line 120, second electrode 82e is electrically connected with bit line 10a, second electrode 82f is electrically connected with bit line 10b, and second electrode 82g is disconnected with bit line 10c.

The disclosed M-Rom can work as follows: a second electrode 10 that is electrically connected with a bit line 82 can be assigned a value of "1", a second electrode 10 that is disconnected with a bit line 82 can be assigned a value of "0", or vice versa. Word lines 20 can be connected to a low voltage for storing the data of each memory cell.

Referring to FIG. 13, when a bit line 10 connected to a high voltage, the diodes corresponding to second electrode 82a, 82b, and 82d respectively can be forward conducted, and the word lines corresponding to the diodes can readout values of "1". And the diode corresponding to second electrode 82c diode can output a value of "0". So the stored information on the bit line 10 is "1101."

Referring to FIG. 14, along a same word line 20, second electrodes 82e, 82f, and 82g are electrically connected respectively to different bit lines 10. When the bit lines 10a, 10b, and 10c are connected respectively to a high voltage, the information stored on the word line 20 is "110."

Comparing to fabricating method for conventional diode-based mask read-only memory, a new diode-based M-ROM in one embodiment can be formed in a semiconductor substrate.

So after the M-ROM has been formed, CMOS devices for composing a peripheral circuit to transfer data the M-ROM can be formed. In this way, some requirements for forming the M-ROM, such as a high temperature condition, may not interfere with the process of forming CMOS devices, and may not affect performances of the CMOS devices as well as interconnecting structures on the CMOS devices. So the CMOS devices can have high performance and reliability.

Further, in one embodiment, a basic memory unit of the disclosed M-ROM is a diode which has a relatively small size comparing to a MOS transistor. So the M-ROM can meet future demand for higher degree of integration, and does not have any disadvantages of the MOS transistor, such as short channel effect, hot carrier effect, source-drain feedthrough problem, and other issues. Therefore, the disclosed diode-based M-ROM can have a high level of reliability.

In addition, CMOS devices can be formed during the fabricating process of the M-ROM in some embodiments.

The fabricating process of the M-ROM and the conventional CMOS fabricating process can be compatible. The specific details are described in the second embodiment of the disclosed subject matter below.

Turning to FIGS. 15-22, schematic diagrams of another exemplary mask read-only memory at various stages during its fabricating process are shown in accordance with various embodiments of the disclosed subject matter.

Figure 15:
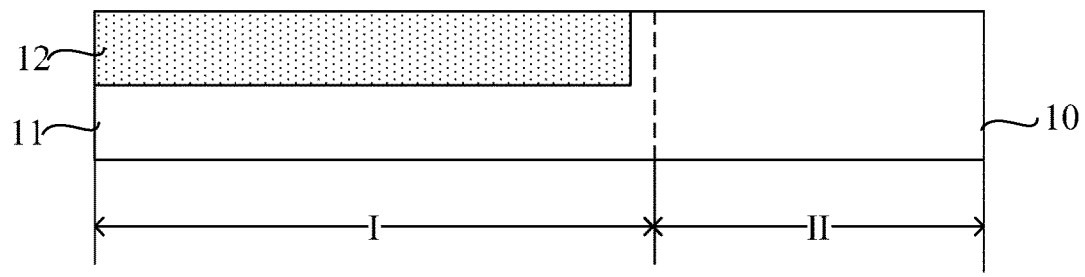
FIGS. 15-22 are schematic diagrams of another exemplary mask read-only memory at various stages during its fabricating process in accordance with various embodiments of the disclosed subject matter.

Referring to FIG. 15, first substrate 10 is provided. First substrate 10 includes first region I for forming a M-ROM, and second region II for forming a MOS transistor. First region I includes first layer 12 having a first doping type and third layer 11 having a second doping type. First layer 12 is located above third layer 11. The first doping type and the second doping type are opposite.

Figure 16:
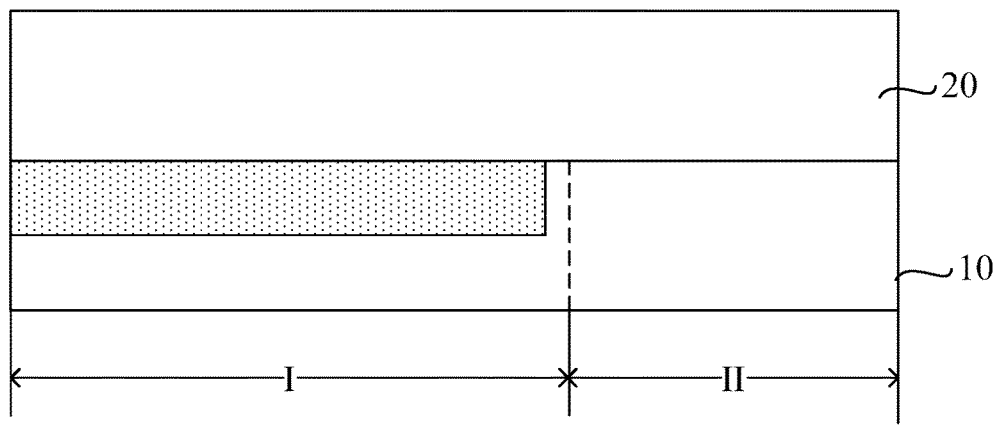

Referring to FIG. 16, in a same process, second substrate 20 is formed above first region I and second region II. Second substrate 20 covers first substrate 10.

Figure 17:
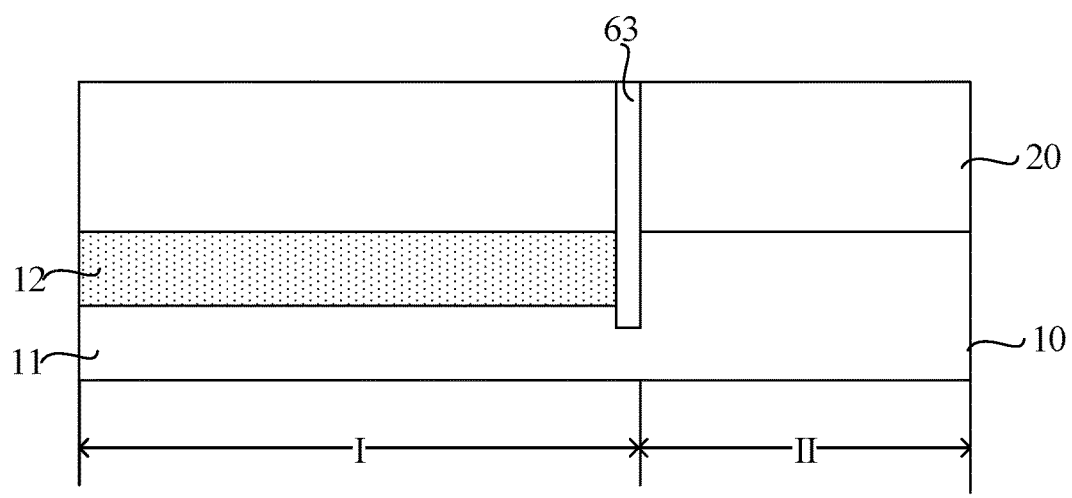

Referring to FIG. 17, forming first isolation structure 63 in second substrate 20, first layer 12, and a certain depth of third layer 11. First isolation structure 63 can be used for isolating first region I and second region II. A formation process of first isolation structure 63 can be referred to the case of forming the first isolation structures 6 in the first embodiment described above in connection with FIGS. 6 and 7.

Figure 18:
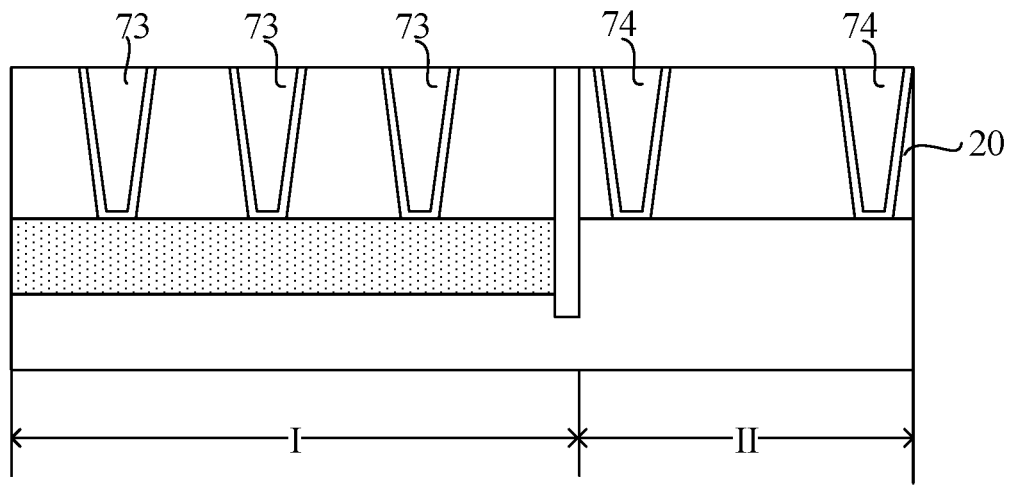

Referring to FIG. 18, second isolation structures 73 can be formed in first region I in second substrate 20, and third isolation structures 74 can be formed in second region II in second substrate 20. The regions between adjacent second isolation structures 73 can be used for forming diodes of M-ROM, and the regions between adjacent third isolation structures 74 can be used for forming MOS transistors. Second isolation structures 73 and third isolation structures 74 can be formed in a same process, which can be referred to the case of forming the second isolation structures 7 in the exemplary embodiment described above in connection with FIGS. 9 and 10.

Figure 19:
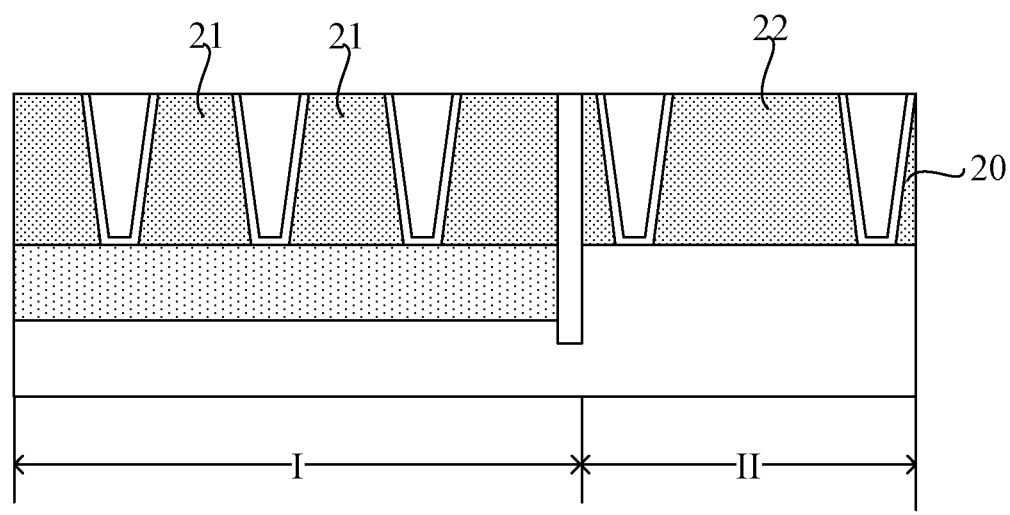

Referring to FIG. 19, a second type doping can be performed in first region I of second substrate 20 to form doped regions 21. Typically, CMOS devices formed on a same substrate can include a first type MOS transistor and a second type MOS transistor. Doped regions 21 and well region 22 of second type MOS transistor can be formed in second substrate 20 in a same process.

Well region of first type MOS transistor can be formed by performing a second type doping in second substrate before or after forming doped regions 21. The first type doping and the second type doping have opposite conductivities, and the first type MOS transistor and the second type MOS transistor are have opposite conductivities.

Then, a high temperature annealing can be performed in a same process to activate the doped ions in doped regions 21 and well region 22.

In the formation process of existing mask read-only memories, a high temperature annealing process can prompt doped ions in the CMOS device region to diffuse and vary a concentration and a depth of the doped region. For example, doped ions in a well region can diffuse into the underlying semiconductor substrate, thereby changing the electrical properties of the CMOS device. However, in one embodiment, a same annealing process can be performed to both well region 22 and doped regions 21, thus ensuring the doping concentration and the depth of well region 22 comply with pre-designed values.

Figure 20:
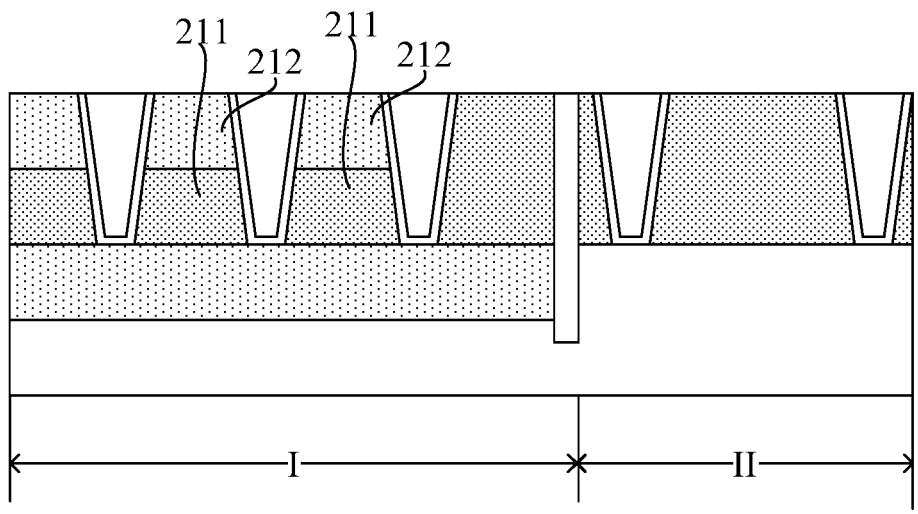

Referring to FIG. 20, a first type doping can be performed in a certain depth of doped regions 21 (see FIG. 19) to form second electrodes 212. Second electrodes 212 have a first doping type, first electrodes 211 have a first second doping type. A first electrode 211 and the corresponding second electrode 212 above constitute a diode. A formation process of first electrodes 211 and second electrodes 212 can be referred to the case of forming the first electrodes 81 and second electrodes 82 in the exemplary embodiment described above in connection with FIGS. 11 and 12.

After second electrodes 212 have been formed, a high temperature annealing process can be performed to activate the dopant in second electrodes 212. Since a temperature of the annealing process is not too high, it will not affect the doping concentration and the depth of well region 22.

Figure 21:
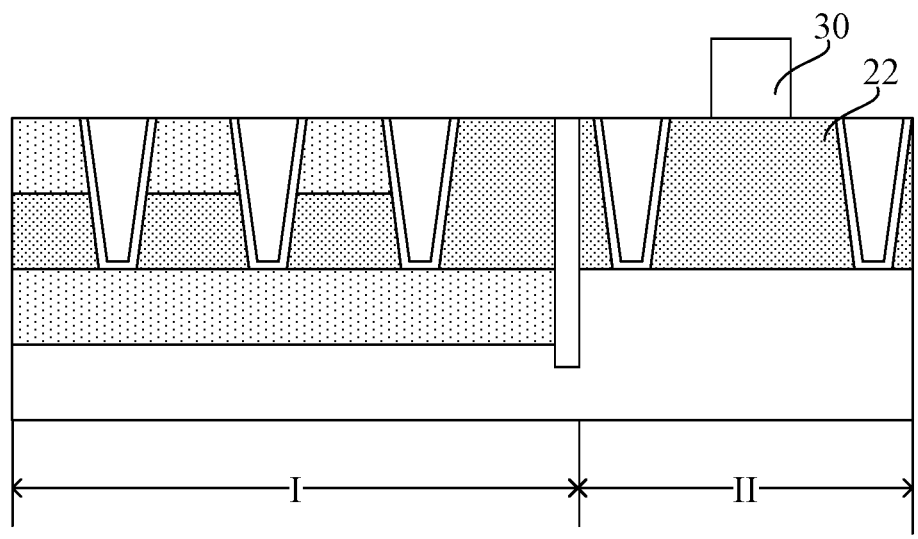

Referring to FIG. 21, after the diodes have been formed in first region I, gate electrode 30 can be formed above well region 22 in second region II.

Figure 22:
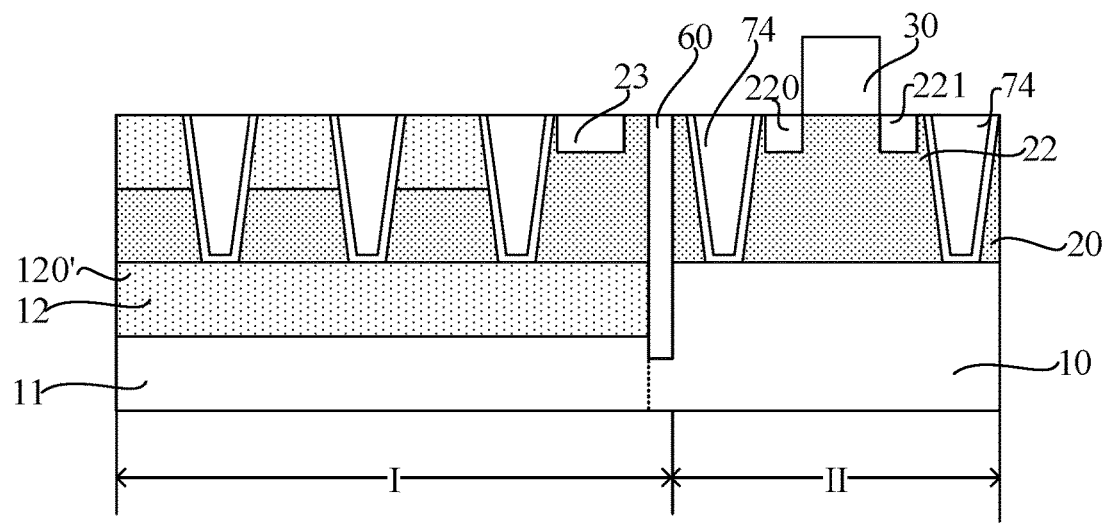

Referring to FIG. 22, in a same process, performing a first type doping to doped region 21 that is above buried line 120' in first region I to form lead region 23, and performing a first type doping to well region 22 locating on both sides of gate electrode 30 in second region II to form source electrode 220 and drain electrode 221. Lead region 23 can be used for connecting buried line 120' and word lines that are to be formed in the subsequent process.

Next, word lines and bit lines that are electrically connected with M-ROM, as well as interconnecting structures that are electrically connected with CMOS can be formed in a same process.

According to the second embodiment of disclosed subject matter, the fabricating method of M-ROM is well compatible with the fabricating method of conventional CMOS device. In the formation process of the M-ROM, peripheral circuit of CMOS device can be formed on the same semiconductor substrate. So a scale production of the M-ROM can be realized, and the fabricating process is simplified, the production efficiency can be improved, and the production costs can be reduced.

Turning to FIGS. 23-26, schematic diagrams of another exemplary mask read-only memory at various stages during its fabricating process are shown in accordance with a third embodiment of the disclosed subject matter.

Figure 23:
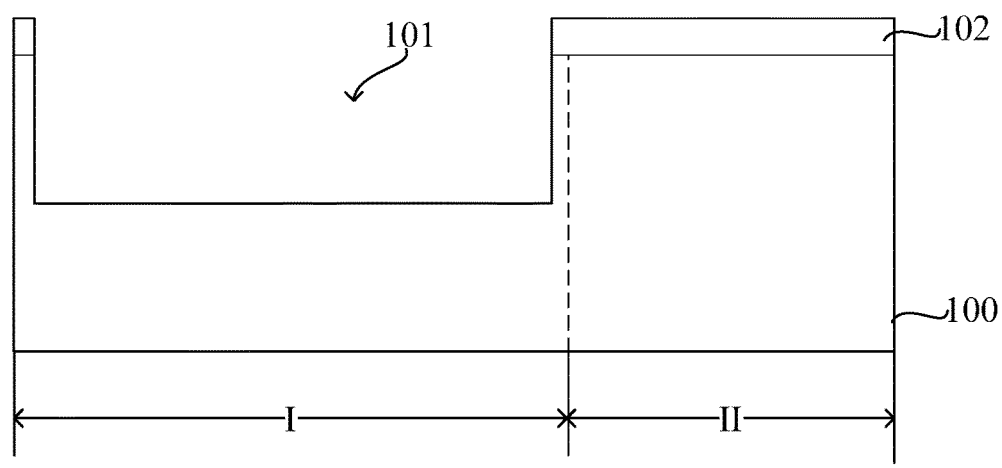
FIGS. 23-26 are schematic diagrams of another exemplary mask read-only memory at various stages during its fabricating process in accordance with various embodiments of the disclosed subject matter.

Referring to FIG. 23, first substrate 100 having second doping type is provided. First substrate 100 includes first region I for forming a M-ROM, and second region II for forming a MOS transistor.

Patterned mask layer 102 is formed on first substrate 100. Patterned mask layer 102 defines first trench 101 in first region I.

Using patterned mask layer 102 as a mask, first substrate 100 is etched to a preset depth to form first trench 101.

Figure 24:
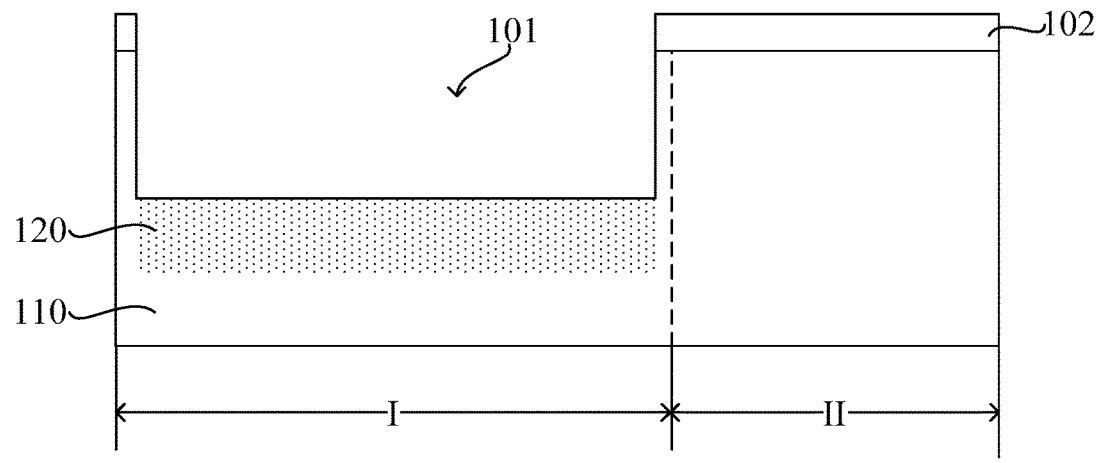

Referring to FIG. 24, using patterned mask layer 102 as a mask, a first type ion implantation is performed to the bottom of first trench 101 to form first layer 120. Third layer 110 is a layer of first substrate 120 below first layer 120.

Figure 25:
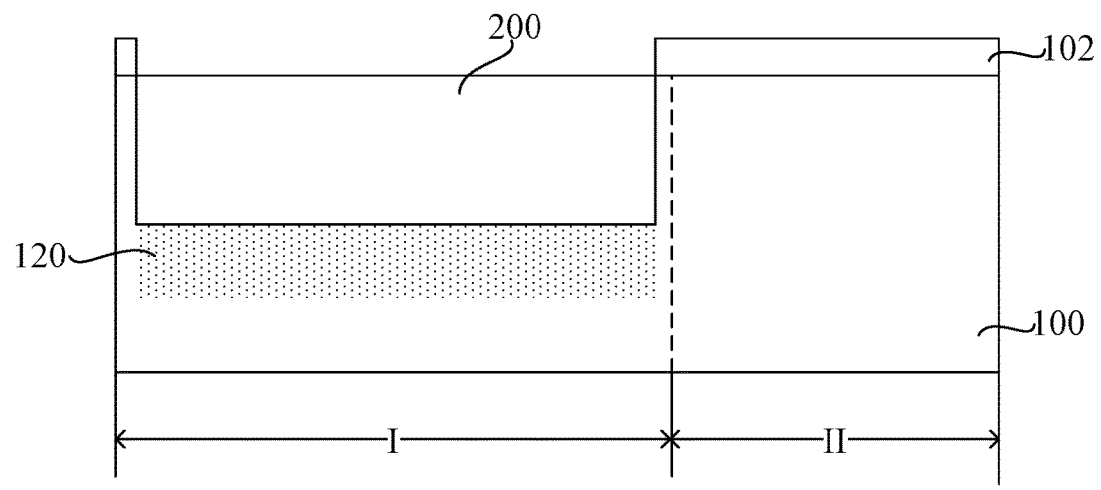

Referring to FIG. 25, using patterned mask layer 102 as a mask, second substrate 200 is formed in first trench 101 using a selective epitaxial growth process. An upper surface of second substrate 200 is in a same flat level of an upper surface of first substrate 100.

Then patterned mask layer 102 can be removed.

Figure 26:
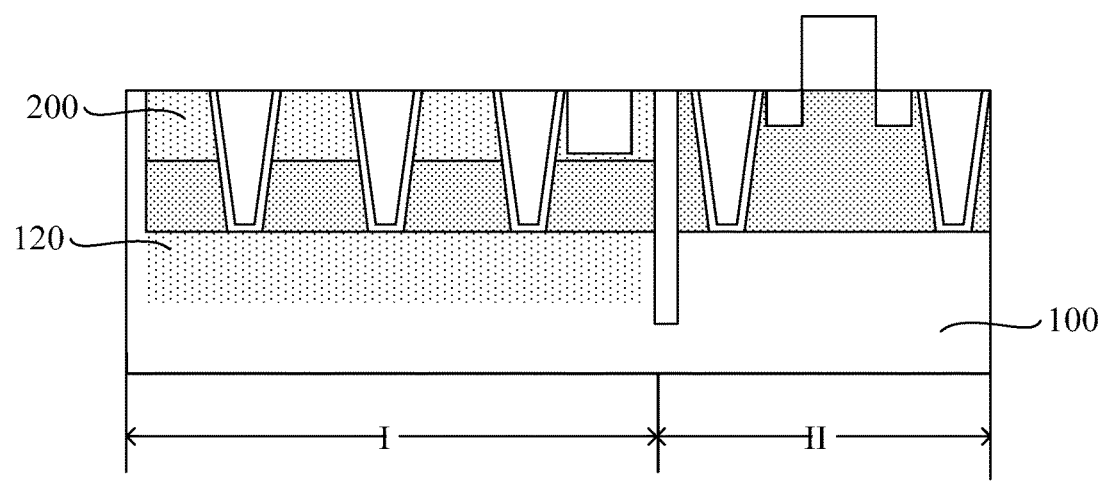

Referring to FIG. 26, multiple diodes of M-ROM can be formed in second substrate 200, and a MOS transistor can be formed in second region II. The specific formation processes can be referred to the second exemplary embodiment described above in FIGS. 15-22.

Comparing to the second exemplary embodiment described above in connection with FIGS. 15-22, in the third exemplary embodiment of the disclosed subject matter, the M-ROM has a smaller thickness than first substrate 100. The M-ROM occupies a smaller space in the thickness direction, and can better meet a high integration density need for developing the integrated circuits.

Another aspect of one disclosure provides a mask read-only memory (M-ROM) device.

In a first embodiment, referring to FIGS. 13 and 14, the M-ROM device can include:

First substrate 1, including first layer 12 and third layer 11. First layer 12 is located above, and directly contacts with third layer 11. First layer 12 has a second doping type, and third layer has a first doping type. The first doping type and the second doping type are opposite. First layer 12 includes multiple buried lines 120 that are in a first direction and isolated from each other.

Second substrate 2 located on third layer 11.

Multiple diodes located in second substrate 2 above buried line 120. The multiple diodes are isolated from each other in a second direction B. Each diode includes a first electrode 81, and a second electrodes 82 that is located on the first electrode 81. In FIG. 13, four diodes correspond to second electrodes 82a, 82b, 82c, and 82d respectively. First electrodes 81 are electrically connected with buried line 120. First electrodes 81 have a second type doping and second electrodes 82 have a first type doping. The first direction A and the second direction B are perpendicular with each other.

In one embodiments, second substrate 2 is monocrystalline silicon substrate.

In one embodiment, a thickness range of second substrate 2 can be from 100 nm to 600 nm.

In one embodiment, multiple first isolation structures 6 are informed in first layer 12 and second substrate 2, multiple second isolation structures 7 are informed in second substrate 2. The multiple first isolation structures 6 are arranged in parallel in the first direction A, and the multiple second isolation structures 7 are arranged in parallel in the second direction B.

A buried line 120 is in between of two adjacent first isolation structures 6. A diode is in between of two adjacent second isolation structures 7.

In one embodiment, each first isolation structure 6 can include:

Second trench 4 in first layer 6 and second substrate 2 (referring to FIG. 6);

First liner layer 5 on sidewalls and bottom layer of second trench 4;

Isolating material filling up in second trench 4. The isolating material can include polysilicon layer 60, and dielectric material layer 61 locating on polysilicon layer 60.

In one embodiment, first isolation structures 6 extend downwardly from first layer 12 into third layer 11.

Multiple diffusion regions 110 are formed in third layer under the bottom layers of first isolation structures 6. Diffusion regions 110 have a second type doping can are used for isolating buried lines 120 and third layer 11 below.

Two adjacent diffusion regions 110 may contact with each other.

In one embodiment, the M-ROM can further include:

Interlayer dielectric layer 9 located on second substrate 2, first isolation structures 6, and second isolation structures 7;

Word lines 20 and bit lines 10 located in interlayer dielectric layer 9.

Word lines 20 are electrically connected with buried lines 120. Each bit line 10 can selectively connected with one or more second electrodes 82 in the first direction A above certain buried lines 120.

In one embodiment, doped region 83 having a first type doping can be formed in second substrate 2. Doped region 83 is electrically connected with buried lines 120, and isolated with all diodes in the second direction B.

Word lines 20 can be electrically connected with buried lines 120 through lead region 83.

In a second embodiment, referring to FIG. 22, first substrate 10 is provided. First substrate 10 includes first region I for forming a M-ROM, and second region II for forming a MOS transistor. The MOS transistor can be configured as a logic circuit of the M-ROM. First region I and region zone II can be isolated by isolation structure 60.

First substrate 10 in first region I can include: third layer 11, and first layer 12 located on third layer 11. First layer 12 is in contact with third layer 11. Third layer 11 has a second type doping, and first layer 12 has a first type doping. The first doping type and the second doping type are opposite.

Second substrate 20 is formed on first substrate 10. Second substrate 20 covers first substrate 10. Multiple diodes are formed in first region I of second substrate 2. Each diode includes first electrode 81, and second electrode 82 located on first electrode 81. Second electrode 82 is in contact with buried line 120'.

A MOS transistor can be formed in second region II of second substrate 2. The MOS transistor can include:

Well region 22 located between third isolation structures 71. Well region 22 has a depth equal to a depth of a diode.

Gate electrode 30 located on well region 22.

Source electrode 220 and drain electrode 221 located in well region 22 and on both sides of gate electrode 30.

Lead region 23 formed in second substrate 2 above buried line 120'. Buried line 120' and lead region 23 both have a first type doping. Lead region 23 is isolated with all diodes. Lead region 23, source electrode 220, and drain electrode 221 are formed in a same process, and have a same depth.

In a third embodiment, referring to FIG. 26, first substrate 100 having a second type doping is provided. First substrate 100 includes first region I for forming a M-ROM, and second region II for forming a MOS transistor.

First trench 101 (referring to FIG. 23) is formed in first region I. A depth of first trench is less than a thickness of first substrate 100.

First region 120 is located in a layer of first substrate 100 that is under first trench 101.

Second substrate 200 is located on first region 120.

A M-ROM is formed in second substrate 200.

A MOS transistor is formed in second region II.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a mask read-only memory (M-ROM) and a related fabricating method are provided.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for fabricating a mask read-only memory device comprising:
   providing a first substrate including a first region and a second region;
   forming a first layer having a first type doping in the first region of the first substrate;
   forming a second substrate on the first region and the second region of the first substrate;
   forming a first isolation structure in the second substrate and partially in the first substrate between the first region and the second region;
   forming a plurality of diodes in the second substrate and on the first layer of the first substrate, wherein the plurality of diodes are arranged in an array,
   wherein each diode comprises:
      a first electrode having a second type doping and connecting with a buried line, and
      a second electrode having a first type doping and located on the first electrode; and
   forming a metal-oxide-semiconductor (MOS) transistor in the second substrate above the second region of the first substrate.

2. The method of claim 1, wherein forming a second substrate on the first region and the second region of the first substrate comprises:
   using an epitaxial process temperature between 950° C. to 1150° C.; and
   using an epitaxial process gas of dichlorosilane.

3. The method of claim 1, wherein forming a second substrate on the first region and the second region of the first substrate comprises:
   using an epitaxial process temperature between 500° C. to 900° C.; and
   using an epitaxial process gas selected from a group of $SiH_4$, $SiHCl_3$, and their combination.

4. The method of claim 1, wherein the first type doping is N-type ions doping, and the second type doping is P-type ions doping.

5. The method of claim 4, wherein:
   the first electrode is heavily doped with dopant ions selected from As, P, Sb, and their combination; and
   the second electrode is lightly doped with dopant ions selected from B and $BF_2$.

6. The method of claim 1, further comprising:
   forming a plurality of second isolation structures in the second substrate to isolate the plurality of diodes from each other in a first direction.

7. The method of claim 6, wherein:
   each second isolation structure comprises a shallow trench having a depth no less than a thickness of the plurality of diodes.

8. The method of claim 1, further comprising:
   forming a plurality of lead regions in the first region of the second substrate, wherein:
      the lead regions have a first type doping, and
      the lead regions and the second electrode are formed in a same process.

9. The method of claim 8, wherein the first isolation structure isolates the plurality of lead regions and the first layer from a well region of the MOS transistor.

10. The method of claim 1, wherein forming the MOS transistor comprises:
    forming a well region of the MOS transistor in the second substrate, wherein:
       the well region has a second type doping, and
       the well region and the first electrode are formed in a same process;
    forming a gate electrode of the MOS transistor on the well region; and
    forming a source electrode and a drain electrode of the MOS transistor in the well region, wherein:
       the source electrode and the drain electrode have a first type doping, and
       the source electrode, the drain electrode, and the second electrode are formed in a same process.

11. The method of claim 10, further comprising:
    forming a third isolation structure in the second region of the second substrate to isolate the well region and the lead region;
    wherein the plurality of second isolation structures and the third isolation structure are formed in a same process.

12. The method of claim 10, further comprising:
    performing an annealing process to activate doped ions in the first electrode and the well region, wherein:
       the annealing process has an annealing temperature range from 950° C. to 1150° C., and
       the annealing process has an annealing time range from 10 s to 120 min.

13. The method of claim 1, wherein the first substrate further includes a third layer having a second type doping, the first layer is formed on the third layer.

14. The method of claim 13, wherein the first isolation structure extends into the third layer of the first substrate.

* * * * *